United States Patent
Lee et al.

(10) Patent No.: US 9,252,181 B2
(45) Date of Patent: Feb. 2, 2016

(54) FILTERLESS COLOR IMAGE SENSOR

(75) Inventors: Su Youn Lee, Yongin-si (KR); Byung Ki Cheong, Seoul (KR); Doo Seok Jeong, Wonju-si (KR)

(73) Assignee: Korea Institute of Science and Technology, Seoul (KR)

(*) Notice: Subject to any disclaimer, the term of this patent is extended or adjusted under 35 U.S.C. 154(b) by 771 days.

(21) Appl. No.: 13/456,991

(22) Filed: Apr. 26, 2012

(65) Prior Publication Data
US 2013/0092818 A1    Apr. 18, 2013

(30) Foreign Application Priority Data
Oct. 13, 2011    (KR) ..................... 10-2011-0104609

(51) Int. Cl.
*H01L 27/146* (2006.01)

(52) U.S. Cl.
CPC ................. *H01L 27/14647* (2013.01)

(58) Field of Classification Search
CPC ............................................. H01L 27/14656
USPC ................ 250/208.1; 257/438, 290–292
See application file for complete search history.

(56) References Cited

U.S. PATENT DOCUMENTS

| | | | |
|---|---|---|---|
| 5,886,353 A * | 3/1999 | Spivey et al. | 250/370.09 |
| 7,233,036 B1 | 6/2007 | Hsu et al. | |
| 7,923,801 B2 * | 4/2011 | Tian et al. | 257/440 |
| 8,253,212 B2 * | 8/2012 | Wronski et al. | 257/438 |
| 2009/0294705 A1 * | 12/2009 | Irisawa et al. | 250/580 |

FOREIGN PATENT DOCUMENTS

| | | |
|---|---|---|
| JP | 05-095128 A | 4/1993 |
| KR | 10-1984-0001163 | 8/1984 |
| KR | 10-2007-0046687 | 5/2007 |
| KR | 10-2011-0104529 A | 9/2011 |
| WO | WO 2010/071874 A2 | 6/2010 |

OTHER PUBLICATIONS

Audet, Yves, et al., "A CMOS Process Compatible Color Sensor using Wavelength Dependent Absorption Depth," IEEE, 2008, pp. 327-330.

Reinhard, D.K. et al., "Electron-and photon-induced conductivity in chalcogenide glasses," J. Appl. Physics, Apr. 1976, vol. 46, No. 4, pp. 1560-1573.

* cited by examiner

*Primary Examiner* — Seung C Sohn
(74) *Attorney, Agent, or Firm* — NSIP Law (57) ABSTRACT

A color image sensor is disclosed. In one aspect, the color image sensor includes: a photo-sensitive cell having a lower electrode, an upper electrode, and a chalcogenide material located between the lower electrode and the upper electrode; and an image sensing circuit for measuring the wavelength or intensity of incident light based on an electric characteristic value generated from the photo-sensitive cell.

19 Claims, 7 Drawing Sheets

Fig. 1A.
Prior Art $T_B$: TRANSFER TRANSISTOR FOR BLUE COLOR SENSING DIODE
$T_G$: TRANSFER TRANSISTOR FOR GREEN COLOR SENSING DIODE
$T_R$: TRANSFER TRANSISTOR FOR RED COLOR SENSING DIODE Fig. 1B.
Prior Art

FILTERLESS COLOR IMAGE SENSOR

CROSS-REFERENCE TO RELATED APPLICATION

This application claims priority to Korean Patent Application No. 10-2011-0104609, filed on Oct. 13, 2011, and all the benefits accruing therefrom under 35 U.S.C. §119, the contents of which in its entirety are herein incorporated by reference.

BACKGROUND

1. Field

The present disclosure relates to a color image sensor, and more particularly, to a color image sensor free from a color filter.

2. Description of the Related Art

Figure 1A:
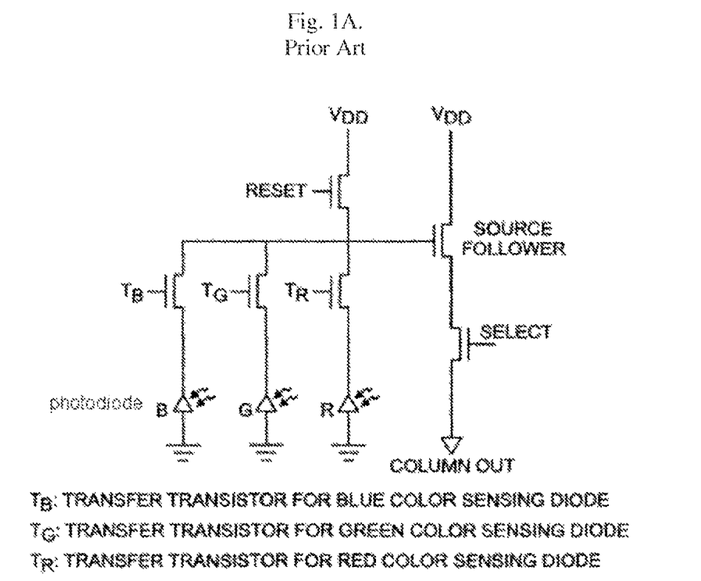
FIG. 1a is a schematic view showing a unit element of a general color image sensor using a color filter.

Referring to FIG. 1a, a color image sensor widely used in the art has a combination of a photo-sensitive cell array and a color filter array. The color filter array filters light of a specific color (wavelength) in an optical way, and the filtered light is sent to a photo-sensitive cell to measure a photoelectric transformation voltage or photoelectric transformation current according to the intensity of the light so as to determine the color and intensity of the light incident to a pixel. However, in this method, a color filter is required since the response of the photo-sensitive cell is not sensitive to the color of light, and for this reason, the production cost is high. In addition, since the color filter array has a horizontal arrangement, the minimum size of the pixel should be greater than a certain level, resulting in a bad resolving power of an image.

Figure 1B:
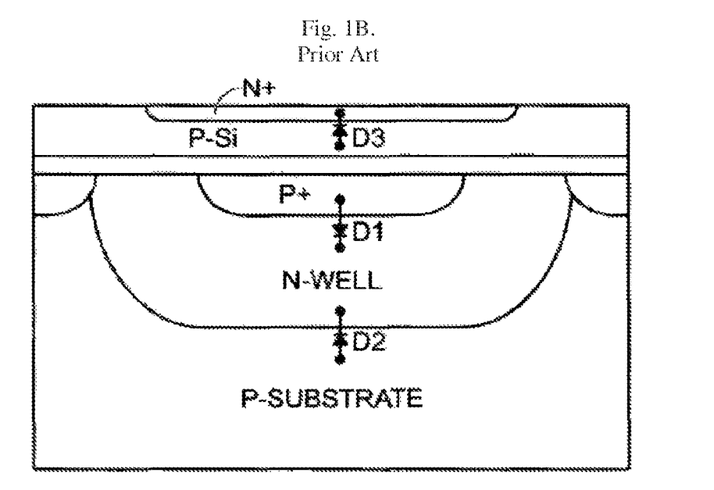
FIG. 1b is a cross-sectional view showing a photo-sensitive cell of a general color image sensor where a triple PN junction is formed by using a dual CMOS layer and a color filter is not used by using the triple PN junction.

To solve this problem, U.S. Pat. No. 7,233,036 B1 and [Yves Audet, et al., "A CMOS Process Compatible Color Sensor using Wavelength Dependent Absorption Depth", IEEE, 2008, pp. 327~330] have proposed a configuration where a triple PN junction photoelectric transformation element is disposed according to the depth as shown in FIG. 1b. In this technique, by using the difference in skin depths according to the wavelength, electric signals generated from photoelectric transformation elements are detected to determine the wavelength of incident light, namely the color and intensity of light. However, since this technique needs complicated photo-lithography and ion implantation processes to form the triple PN junction, and therefore the production cost is high.

SUMMARY

According to one aspect of the present disclosure, it is possible to improve a resolving power of a color image sensor by reducing the size of a pixel.

According to another aspect of the present disclosure, it is possible to manufacture a color image sensor free from a color filter.

According to another aspect of the present disclosure, it is possible to manufacture a color image sensor through a simple process.

In one aspect, there is provided a color image sensor, which includes: a photo-sensitive cell having a lower electrode, an upper electrode, and a chalcogenide material located between the lower electrode and the upper electrode; and an image sensing circuit for measuring the wavelength or intensity of incident light based on an electric characteristic value generated from the photo-sensitive cell.

In another aspect, the chalcogenide material may include at least one element selected from the group consisting of sulfur (S), selenium (Se) and tellurium (Te).

In another aspect, the chalcogenide material may be a combination of at least one element selected from the group consisting of sulfur (S), selenium (Se), and tellurium (Te) and at least one element selected from the group consisting of copper (Cu), zinc (Zn), gallium (Ga), cadmium (Cd), indium (In), and tin (Sn).

In another aspect, the chalcogenide material may be a combination of at least one element selected from the group consisting of sulfur (S), selenium (Se), and tellurium (Te) and at least one element selected from the group consisting of silicon (Si), germanium (Ge), phosphorus (P), arsenic (As), and antimony (Sb).

In another aspect, the chalcogenide material may have a band gap of 1.8 eV to 3.1 eV.

In another aspect, a band bending direction between the upper electrode and the chalcogenide material may be identical to a band bending direction between the lower electrode and the chalcogenide material.

In another aspect, the upper electrode may be made of at least one material selected from the group consisting of a metal film, a semiconductor, and a transparent conducting oxide, and the lower electrode may be made of at least one material selected from the group consisting of molybdenum (Mo), gold (Au), silver (Ag), and platinum (Pt).

In another aspect, the image sensing circuit may include: a power supply for supplying a variable power to the photo-sensitive cell; and a plurality of storage elements synchronized to the variable power and storing an electric characteristic value generated at the photo-sensitive cell, wherein the wavelength or intensity of incident light are measured based on the electric characteristic value respectively stored in the plurality of storage elements.

In another aspect, the plurality of storage elements may be a first capacitor and a second capacitor.

In another aspect, the color image sensor may further include: a first switching element for opening or closing a channel between the photo-sensitive cell and the first capacitor; a second switching element for opening or closing a channel between the photo-sensitive cell and the second capacitor; and a multiplexer synchronized with the variable power of the power supply to control a switching time of the first switching element and the second switching element, wherein the wavelength and intensity of incident light may be measured based on the voltage values of the first capacitor and the second capacitor.

In another aspect, the first switching element and the second switching element may be transistors.

In another aspect, there is also provided a color image sensor, which includes: an image sensor array wherein a plurality of unit elements, each having a photo-sensitive cell including a lower electrode, an upper electrode, and a chalcogenide material located between the lower electrode and the upper electrode, are arranged; a column/row decoder for selecting a unit element of the image sensor array; a power supply for supplying power to the image sensor array; and a multiplexer for allowing the power supply to apply a variable power.

In another aspect, the unit element may include: a first storage element and a second storage element for storing the size of an electric characteristic value generated at the photo-sensitive cell; a first switching element for opening or closing a channel between the photo-sensitive cell and the first storage element; and a second switching element for opening or closing a channel between the photo-sensitive cell and the second storage element, wherein the color image sensor may measure the wavelength and intensity of incident light based on the voltage values of the first capacitor and the second capacitor.

In another aspect, the first storage element and the second storage element may be capacitors.

In another aspect, the first switching element and the second switching element may be transistors.

According to one aspect of the present disclosure, the resolving power may be improved in comparison to an existing technique. In other words; since a color filter having a horizontal array is not used, the size of the pixel may be reduced. An existing color sensor is generally a Bayer filter, which uses four filters in total, namely one red filter, two green filters and one blue filter. Therefore, the existing color sensor configures a single pixel with four photodiodes. However, the color image sensor according to the present disclosure configures a single pixel with one photodiode, and so, assuming that photodiodes have the same size, the size of the pixel may be reduced into ¼. Therefore, the resolving power may be increased four times.

According to another aspect of the present disclosure, the process cost may be greatly reduced in comparison to an existing technique. First, since a color filter is not used, the process cost is reduced as much as the cost required for making the color filter, and so the manufacture cost may be greatly lowered. In addition, in the case of a photodiode using a crystalline or amorphous silicon, the diode should be formed by means of ion implantation or the like. However, in the case of the color filter sensor according to the present disclosure, a junction between metal and a chalcogenide film is simply formed to realize photodiode characteristics, and so the process cost may be greatly reduced.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION OF MAIN ELEMENTS

10: shutter device
100: photo-sensitive cell
110: upper electrode
120: chalcogenide material
130: lower electrode
200: multiplexer
300: power source device
410: first transistor
420: second transistor
510: first capacitor
520: second capacitor
600: amplifier
1000: image sensor array

DETAILED DESCRIPTION

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments. Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
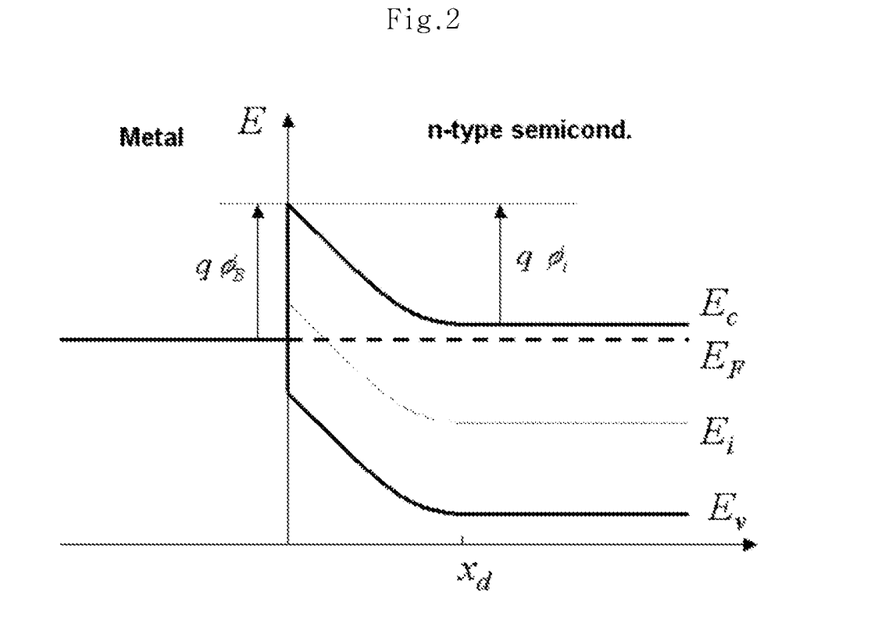
FIG. 2 is a graph showing a bending phenomenon of an electron band, which occurs at a junction between an n-type semiconductor and a metal having a great work function.

Instead of a general photodiode having a PN junction, the present disclosure uses 1) an amorphous or polycrystalline chalcogenide semiconductor, 2) a principle that the skin depth varies depending on the wavelength of incident light, and 3) a band bending phenomenon occurring at a metal-semiconductor junction. FIG. 2 shows a band bending phenomenon at an n-type semiconductor junction with a metal generally having a great work function, for better understanding. The band bending phenomenon means that, in the case where a semiconductor electrode is used, electron transition occurs at the interface of the semiconductor for balancing charge transfer, and as a result an energy band in the semiconductor is bent. The band bending phenomenon is limited only to a surface portion having a space charge layer, and it meaningfully enables electric switching of photo energy.

Figure 3:
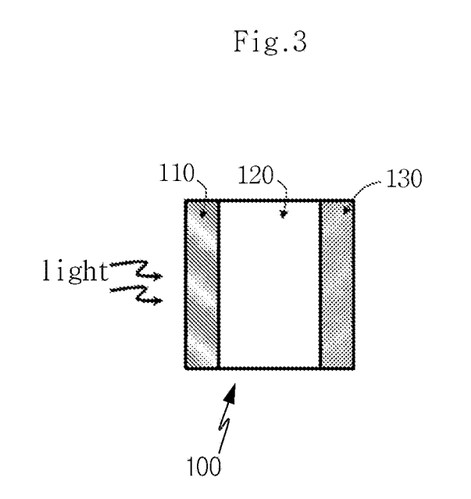
FIG. 3 is a cross-sectional view showing a photo-sensitive cell 100 according to an embodiment of the present disclosure.

FIG. 3 is a cross-sectional view showing a photo-sensitive cell according to the present disclosure. The photo-sensitive cell includes an upper electrode 110 where light is incident on the cell, a chalcogenide material 120, and a lower electrode 130 having a high work function. The chalcogenide material 120 is disposed between the upper electrode 110 and the lower electrode 130. The upper electrode 110 is a layer where the incident light primarily enters the photo-sensitive cell. The upper electrode 110 should have transparency so that light may easily pass, and also should have conductivity so that current may easily flow. In one embodiment, the upper electrode 110 is a metal film with a small thickness, but it may also be a semiconductor, a transparent conducting oxide (TCO) or the like, without being limited thereto. The upper electrode 110 is located on a chalcogenide material 120, described later, and is connected to a wiring for the upper electrode. In one embodiment, the upper electrode 110 may be deposited on the chalcogenide material 120, and various film deposition methods such as sputtering, CVD, and evaporation may be used.

The chalcogenide material 120 is a collective name for compounds containing sulfur (S), selenium (Se), or tellurium (Te). As photoelectric material, the chalcogenide material 120 has following advantages: first, the chalcogenide material has great photoelectric transformation efficiency in comparison to silicon, and second, the chalcogenide material may make a junction whose features are similar to PN junction when contacting metal. Since PN features may be realized only by the contact with metal, a complicated process for making a PN junction at silicon may be excluded, which lowers the production cost. Since the band gap of the chalcogenide material 120 is greater than the band gap of silicon (Eg=1.1 eV), the band gap is generally located at a portion where visible ray spectrum is biggest, which gives a great photoelectric effect. CuInGaSe which is a kind of chalcogenide material is being actively studied as material of a solar cell. In order to implement the color image sensor according to the present disclosure, the chalcogenide material should have the following features: the band gap (Eg) should be equal to or smaller than the energy region of visible rays (1.8-3.1 eV), and the light absorption coefficient should be great. In one embodiment, the chalcogenide material 120 may be multi-component material, which is at least two-component system, composed by combining at least one element selected from the group consisting of Si, Ge, P, As, and Sb, which are semimetal elements belonging to Group 4 or 5 in the periodic table, with at least one element selected from the group consisting of S, Se, and Te, which are chalcogen elements. In addition, the chalcogenide material 120 may also be multi-component material, which is at least two-component system, composed by combining at least one element selected from the group consisting of Cu, Zn, Ga, Cd, In, and Sn, with at least one element selected from the group consisting of S, Se, and Te, which are chalcogen elements. In one embodiment, the chalcogenide material 120 may be deposited on the lower electrode 130, and various film deposition methods such as sputtering, CVD, and evaporation may be used.

The lower electrode 130 employs metal with high electric conductivity and high work function. In one embodiment, the lower electrode 130 may be made of Mo, Au, Ag, or Pt. The lower electrode 130 is located at a silicon substrate and is connected to a wiring for the lower electrode. Similar to the upper electrode 110 and the chalcogenide material 120, the lower electrode 130 may be deposited by using various film deposition methods such as sputtering, CVD, and evaporation.

Figure 4A:
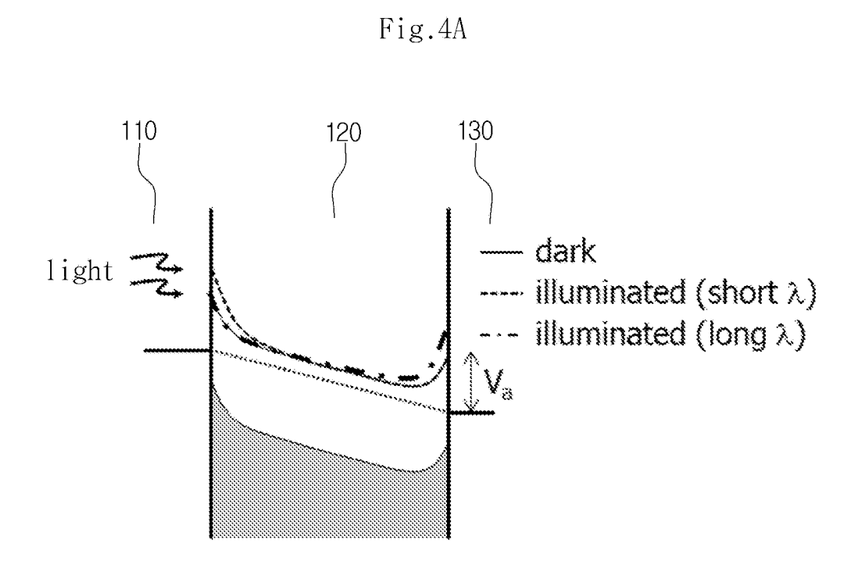
FIG. 4a is a graph showing the bending of an electron band structure in the photo-sensitive cell when light is not incident, when light is incident, when light with a long wavelength is incident, and when light with a short wavelength is incident, according to an embodiment of the present disclosure.

FIG. 4a is a graph showing the bending of an electron band structure in the photo-sensitive cell when light is not incident, when light is incident, when light with a long wavelength is incident, and when light with a short wavelength is incident. In a state where a voltage is applied to the photo-sensitive cell including the upper electrode 110, the n-type chalcogenide material 120 and the lower electrode 130 (the upper electrode: 0, the lower electrode: $V=V_a>0$), the bending of a conduction band is depicted at the case where light is not incident (solid line, dark), at the case where light with a short wavelength is incident (dotted line, illuminated short A), and at the case where light with a long wavelength is incident (chain line, illuminated long A). In the case where light with a short wavelength is incident (dotted line), in comparison to the case where light is not incident (solid line), the band bending increases near the upper electrode. On the contrary, in the case where light with a long wavelength is incident (chain line), the band bending increases near the lower electrode. Fermi potentials are respectively depicted at the upper electrode 110 and the lower electrode 130, and the difference in Fermi potentials is as much as Va. A valance band is depicted at the lower end of the Fermi potential. The skin depth δ according to the wavelength of incident light may be calculated according to Equation 1 below.

$$\delta = \left(\frac{\sqrt{2}}{\omega\sqrt{\mu\epsilon}}\right)\left[\sqrt{1+\left(\frac{\sigma}{\omega\epsilon}\right)^2}-1\right]^{-1/2} \quad \text{Equation 1}$$

In Equation 1, $\omega=2\pi*f$ (f=oscillation frequency), μ is magnetic susceptibility, ε is a dielectric constant, and σ is electrical conductivity. Since the wavelength is in reverse proportion to the oscillation frequency, it could be understood from Equation 1 that the skin depth into the chalcogenide material 120 increases as the wavelength of light is longer.

Figure 4B:
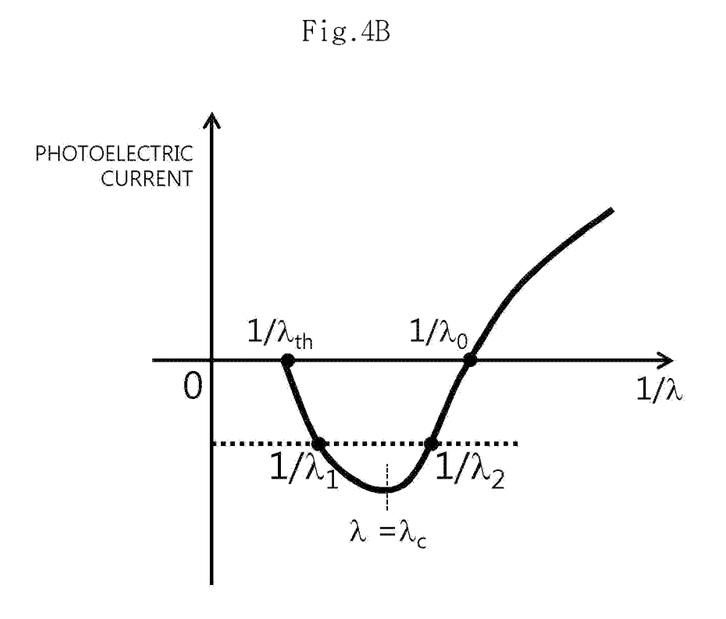
FIG. 4b is a graph showing the intensity of a photoelectric current according to the wavelength of incident light according to an embodiment of the present disclosure.

FIG. 4b is a graph showing the intensity of a photoelectric current according to the wavelength of incident light, namely a photoelectric current-wavelength characteristic curve. The photoelectric current $\Delta I_{ph}$ is defined as in Equation 2 below.

$$\Delta I_{ph} = I_{ph} - I_{dark} \quad \text{Equation 2}$$

Near the upper electrode 110, electrons generated by the light with a short wavelength (dotted line in FIG. 4a) receive a force toward the lower electrode 130, and the current in this direction is defined as (+). On the contrary, if the light with a long wavelength (chain line in FIG. 4a) is incident, many electrons are generated near the lower electrode 130, and the electrons receive a force toward the upper electrode. Therefore, the direction of current is reversed. If the incident light has a wavelength gradually increasing and thus has smaller energy than the band gap, a photoelectron may not be generated, and so the photoelectric current-wavelength characteristic curve as shown in FIG. 4b is exhibited. Therefore, the photoelectric current shifts its sign as the wavelength of light changes, and this has been experimentally proved in [D. K. Reinhard, D. Alder, and F. O. Arntz, J. Appl. Phys. 47, 1560 (1976)].

The photoelectric current-wavelength characteristic curve is defined as a unique curve at a specific voltage (the upper electrode: 0, the lower electrode: V=Va>0) applied to the photo-sensitive cell, and this may be recorded as a database. If the amount of photoelectric current generated at the photo-sensitive cell is measured and is applied to the photoelectric current-wavelength characteristic curve, the wavelength of light may be figured out, but in the case where the measured photoelectric current has a negative value, it is impossible to know whether the wavelength is $\lambda_1$ or $\lambda_2$ as shown in FIG. 4b.

Figure 5A:
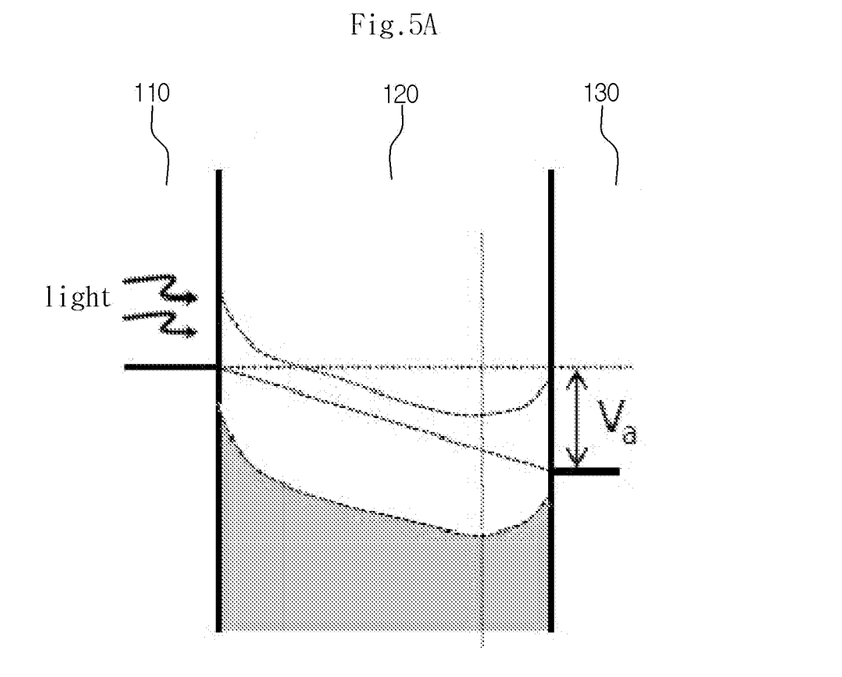
FIG. 5a is a graph showing the bending of an electron band structure in the photo-sensitive cell, after a voltage $V_a$ is applied to the photo-sensitive cell, according to the present disclosure.
Figure 5B:
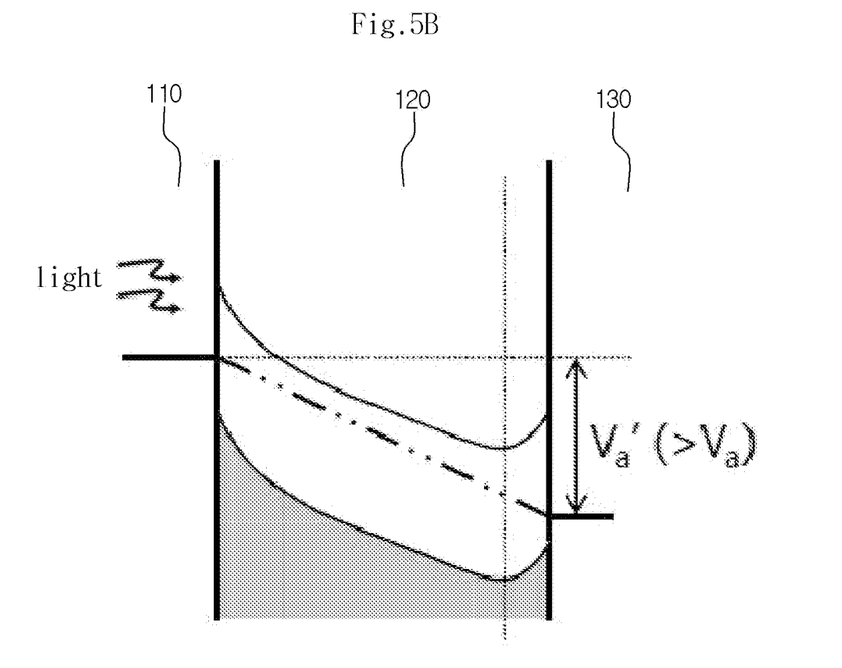
FIG. 5b is a graph showing the bending of an electron band structure in the photo-sensitive cell, after a voltage $V_a'$ is applied to the photo-sensitive cell, according to the present disclosure.

FIG. 5a is a graph showing the bending of an electron band structure in the photo-sensitive cell after a voltage $V_a$ (the lower electrode: +$V_a$, the upper electrode: 0) is applied to the photo-sensitive cell, and FIG. 5b is a graph showing the bending of an electron band structure in the photo-sensitive cell after a voltage $V_a'$ (the lower electrode: +$V_a'$: the upper electrode: 0) is applied to the photo-sensitive cell. In the case of FIG. 5b, in comparison to FIG. 5a, since the lowest point of the conduction band moves toward the lower electrode, it may be expected that the "wavelength $\lambda_0$ where the direction of current shifts from positive to negative" increases.

Figure 5C:
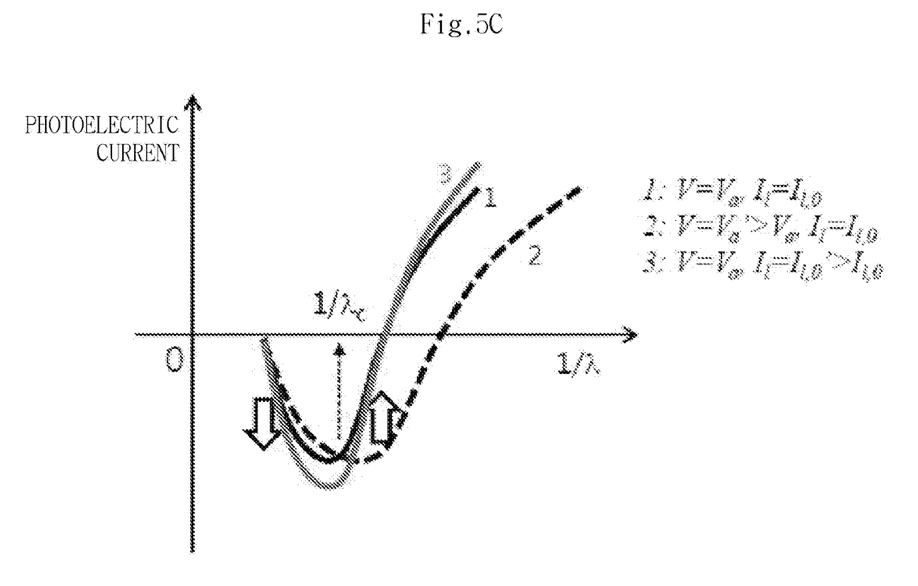
FIG. 5c is a graph showing the change of a wavelength-photoelectric current characteristic curve, when the voltage applied to the photo-sensitive cell 100 and the intensity of light incident thereto change, according to an embodiment of the present disclosure.
Figure 5D:
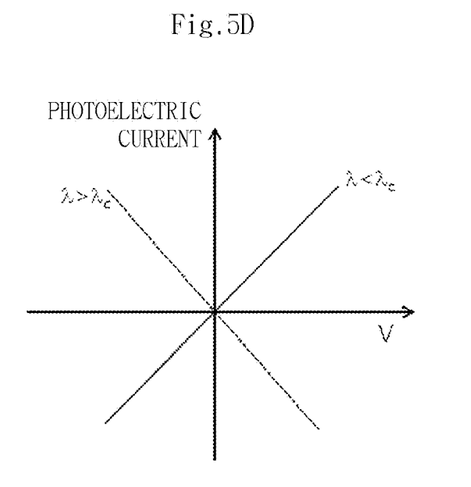
FIG. 5d is a graph showing the change of photoelectric current-voltage characteristic curve depending on the wavelength of light incident to the photo-sensitive cell 100 according to an embodiment of the present disclosure.

FIG. 5c is a graph showing the change of a wavelength-photoelectric current characteristic curve when the voltage applied to the photo-sensitive cell 100 and the intensity of light change. It could be found that, when the intensity of light is consistently $I_{l0}$, the characteristic curve 2 which applies $V_a'$ moves right in comparison to the characteristic curve 1 which applies $V_a$ (but, the left x fraction is fixed since the work function is not changed). As a result, referring to FIG. 5d, it could be expected that the slope of the current-voltage curve becomes positive (+) at a wavelength $\lambda_2$ smaller than a specific wavelength $\lambda_c$, and the slope of the current-voltage curve becomes negative (−) at a wavelength $\lambda_1$ greater than the specific wavelength. Therefore, even though the $\lambda_1$ and $\lambda_2$ could not be determined in FIG. 4b, one of $\lambda_1$ and $\lambda_2$ may be determined through the slope of the current-voltage curve, and so the relation between the wavelength of light and $\lambda_c$ may be figured out.

In addition, it could be found that the characteristic curve 3 where the applied voltage $V_a$ is consistent and the intensity of incident light is $I_{l,0}'$ has "multiple" current amount in comparison to the characteristic curve 1 having $I_{l,0}$. If the intensity of incident light increases, the number of generated charges increases, and so the above result is natural. If this is arranged into a simple equation, the photoelectric current $I_e$ may be given as a function of the intensity of light $I_l$, the wavelength of light $\lambda$, and the applied voltage V as in Equation 3 below.

$$I_e = f(I_l, \lambda, V) \quad \text{Equation 3}$$

Since the intensity of light is expected as increasing the intensity of the photoelectric current into "multiple" in the entire wavelength region as described above, the above equation is divided into Equations 4 to 6 below.

$$I_e = g(I_l) h(\lambda, V) \quad \text{Equation 4}$$

$$I_e(V_a) = g(I_l) h(\lambda, V_a) \quad \text{Equation 5}$$

$$I_e(V_a') = g(I_l) h(\lambda, V_a') \quad \text{Equation 6}$$

In Equations 4 to 6, if $I_e(V_a)$ and $I_e(V_a')$ are measured, two equations for $I_l$ and $\lambda$ may be obtained. Therefore, if the pattern of the photoelectric current-wavelength-voltage characteristic curve (Function h ($\lambda$, V)) of the photo-sensitive cell is investigated, and also if the pattern of the investigated photoelectric current-light intensity characteristic curve (Function g ($I_l$)) is recorded as a database and compared with the measured value, it is possible to calculate the wavelength and intensity of incident light from the measured $I_e(V_a)$ and $I_e(V_a')$.

Figure 6:
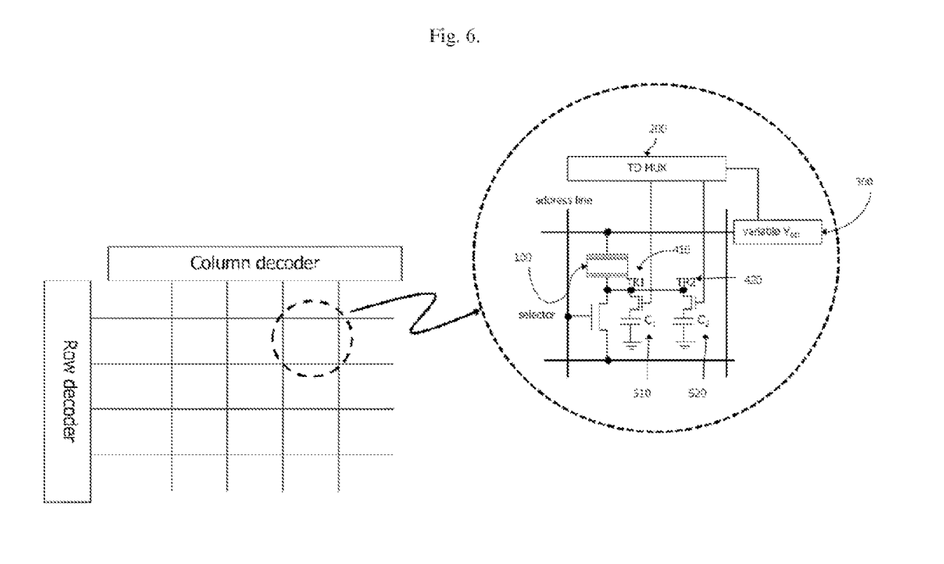
FIG. 6 is a schematic view showing a unit element of a color image sensor according to an embodiment of the present disclosure.

FIG. 6 is a schematic view showing a unit element of a color image sensor free from a color filter according to the present disclosure. The unit element of the color image sensor includes a photo-sensitive cell 100 and an image sensing circuit for measuring the wavelength and intensity of incident light based on the current generated at the photo-sensitive cell 100. As shown in FIG. 6, the image sensing circuit includes a multiplexer (a time division multiplexer) 200, a power supply 300, a first transistor 410, a second transistor 420, a first capacitor 510, and a second capacitor 520, and may further include a column/row decoder which may select a specific cell.

In one embodiment, a color image sensing process will be described on the assumption that light is incident to a photo-sensitive cell through a certain path. First, a voltage is applied to a gate of a transistor of a cell selected by the column/row decoder so that a variable bias voltage is applied to the photo-sensitive cell 100. The first transistor 410 and the second transistor 420 are turned on subsequently by the multiplexer 200, and voltages applied to the first capacitor 510 and the second capacitor 520 are respectively measured. A photoelectric current generated from the photo-sensitive cell is calculated through the measured voltages applied to the first capacitor 510 and the second capacitor 520 (i=Cdv/dt). Referring to the photoelectric current-wavelength characteristic curve, the wavelength and intensity of the light incident to the photo-sensitive cell 100 may be calculated based on the photoelectric current and the bias voltage applied to the photo-sensitive cell 100.

The photo-sensitive cell 100 includes the upper electrode 110, the chalcogenide material 120, and the lower electrode 130 as described above.

Figure 7:
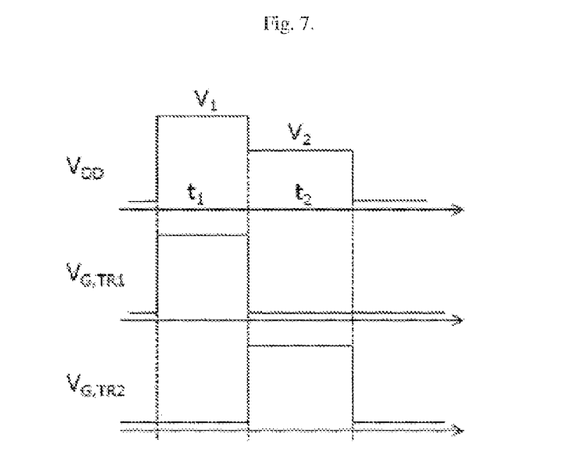
FIG. 7 is a graph showing the power applied for operating the color image sensor according to an embodiment of the present disclosure as well as the change of the gate voltage of a first transistor 410 and the gate voltage of a second transistor 420.

The multiplexer (time division multiplexer) 200 plays a role of synchronizing the variable power division time of the power supply 300 with the switching time of the first transistor 410 and the second transistor 420. As shown in FIG. 7, while the variable power $V_{DD}$ of the power supply 300 is $V_1$, the multiplexer 200 plays a role of turning on the first transistor and turning off the second transistor. While the variable power $V_{DD}$ is $V_2$, the multiplexer 200 plays a role of turning on the second transistor and turning off the first transistor.

The power supply 300 plays a role of applying voltage to the photo-sensitive cell. As shown in FIG. 7, the variable power of the power supply 300 supplies $V_1$ and $V_2$ in a time division manner.

The first transistor 410 and the second transistor 420 respectively play a role of opening or closing channels between the first capacitor 510 and the photo-sensitive cell 100 and between the second capacitor 520 and the photo-sensitive cell 100. The first transistor 410 and the second transistor 420 are controlled by the multiplexer 200. Even though only the transistor is depicted in the figure, any kind of switching means capable of opening or closing the channels may be used, without being limited to the above.

The first capacitor 510 and the second capacitor 520 play a role of storing charges generated at the photo-sensitive cell 100. Even though the capacitor is depicted in the figures, any kind of storage means capable of storing charges may be used. Since voltages applied to a cell should be measured from at least two different points within a specific photosensitive time, at least two capacitors are required to store the generated charges. However, the number of capacitors may be greater than 2, without being limited to 2. In one embodiment, the voltage of the capacitor is measured, and the amount of photoelectric current stored in the capacitor is measured through the capacitance of the capacitor (i=Cdv/dt).

The column/row decoder plays a role of selecting a specific photo-sensitive cell, among a plurality of photo-sensitive cells. In FIG. 6, a row and a column are selected through the address line X and the address line Y, and the transistor is operated through a selector to operate the transistor so that the bias voltage of the power supply 300 may be applied to the photo-sensitive cell.

Figure 8:
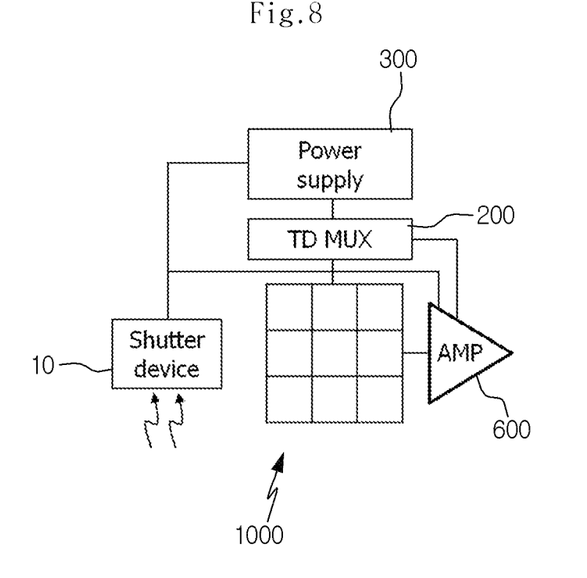
FIG. 8 is a schematic diagram showing a color image sensor device including a shutter device 10, a color image sensor array 1000 composed of color image sensor unit elements, a power supply 300, a multiplexer 200, and an amplifier 600.

FIG. 8 is a schematic view showing a perfect form of the color image sensor including a shutter device 10, an image sensor array 1000 composed of color image sensor unit elements, a power supply 300, a multiplexer 200, and an amplifier 600.

Here, the image sensor array 1000 is a device where a plurality of unit elements of the color image sensor illustrated in FIG. 6 is arranged. The image sensor array 1000 may include a column/row decoder for selecting a unit element. The unit element at the image sensor array 1000 includes a photo-sensitive cell 100, a first capacitor 510 and a second capacitor 520 for storing the intensity of current generated at the photo-sensitive cell, a first transistor 410 for opening or closing a channel between the photo-sensitive cell and the first capacitor 510, and a second transistor 420 for opening or closing a channel between the photo-sensitive cell and the second capacitor 520.

The color image sensor of FIG. 8 is different from that of FIG. 6 in the point that the shutter device 10 for determining shielding of light is added and a single image sensor unit element is extensively expressed as the image sensor array 1000. In addition, an amplifier 600 for amplifying the output of the image sensor array 1000 to calculate the wavelength and intensity of light is added.

Now, a method for manufacturing the above color image sensor will be described as an embodiment. However, the present disclosure is not limited to the following description.

(1) A cell selection CMOS, a capacitor, and peripheral circuits are configured on a silicon substrate. Since they use an existing CMOS process, they are not specially limited in detail in the present disclosure.

(2) A wiring to be connected to the lower electrode of the photo-sensitive cell is formed. The wiring may be formed by depositing suitable metal, for example aluminum, tungsten, copper or the like, and then performing photo-lithography and dry- or wet-etching, or may be obtained by forming a concave pattern in an insulation layer, for example $SiO_2$, SiON or the like, depositing a metal layer and then performing CMP.

(3) The lower electrode 130 is deposited in the range of several ten nm to several um. The lower electrode is made of metal having high electric conductivity and high work function, for example Mo, Au, Ag, Pt or the like. Various film deposition methods such as sputtering, CVD, and evaporation may be used.

(4) The chalcogenide material 120 is deposited in the range of several ten nm to several um. The chalcogenide material may employ multi-component material, which is at least two-component system, composed by combining at least one element selected from the group consisting of Si, Ge, P, As, and Sb, which are semimetal elements belonging to Group 4 or 5 in the periodic table, with at least one element selected from the group consisting of S, Se, and Te, which are chalcogen elements; or multi-component material, which is at least two-component system, composed by combining at least one element selected from the group consisting of Cu, Zn, Ga, Cd, In, and Sn, with at least one element selected from the group consisting of S, Se, and Te, which are chalcogen elements. Various film deposition methods such as sputtering, CVD, and evaporation may be used.

(5) The upper electrode 110 is deposited in a suitable thickness. A metal film with a small thickness, a semiconductor, a transparent conducting oxide (TCO) or the like may be used as material of the upper electrode. Various film deposition methods such as sputtering, CVD, and evaporation may be used as described above.

(6) The photo-sensitive cell 100 is patterned to have suitable size and shape by means of photo-lithography or e-beam lithography.

(7) The photo-sensitive cell 100 is patterned by means of dry etching or wet etching. The dry etching methods such as reactive ion etching (RIE) and ion milling may be used.

(8) A wiring to be connected to the upper electrode 110 of the photo-sensitive cell 100 is formed. The wiring may be formed by depositing suitable metal, for example aluminum, tungsten, copper or the like, and then performing photo-lithography and dry- or wet-etching, or may be obtained by forming a concave pattern in an insulation layer, for example $SiO_2$, SiON or the like, depositing a metal layer and then performing CMP.

While the exemplary embodiments have been shown and described, it will be understood by those skilled in the art that various changes in form and details may be made thereto without departing from the spirit and scope of the present disclosure as defined by the appended claims.

In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A color image sensor, comprising:
a photo-sensitive cell having a lower electrode, an upper electrode, and a chalcogenide material located between the lower electrode and the upper electrode; and
an image sensing circuit for measuring the wavelength or intensity of incident light based on an electric characteristic value generated from the photo-sensitive cell,
wherein the lower electrode is made of at least one metal selected from the group consisting of molybdenum (Mo), gold (Au), silver (Ag), and platinum (Pt).

2. The color image sensor according to claim 1, wherein the chalcogenide material includes at least one element selected from the group consisting of sulfur (S), selenium (Se) and tellurium (Te).

3. The color image sensor according to claim 1, wherein the chalcogenide material is a combination of at least one element selected from the group consisting of sulfur (S), selenium (Se), and tellurium (Te) and at least one element selected from the group consisting of copper (Cu), zinc (Zn), gallium (Ga), cadmium (Cd), indium (In), and tin (Sn).

4. The color image sensor according to claim 1, wherein the chalcogenide material is a combination of at least one element selected from the group consisting of sulfur (S), selenium (Se), and tellurium (Te) and at least one element selected from the group consisting of silicon (Si), germanium (Ge), phosphorus (P), arsenic (As), and antimony (Sb).

5. The color image sensor according to claim 1, wherein the chalcogenide material has a band gap of 1.8 eV to 3.1 eV.

6. The color image sensor according to claim 1, wherein a band bending direction between the upper electrode and the chalcogenide material is identical to a band bending direction between the lower electrode and the chalcogenide material.

7. The color image sensor according to claim 1, wherein the upper electrode is made of at least one material selected from the group consisting of a metal film, a semiconductor, and a transparent conducting oxide.

8. The color image sensor according to claim 1, wherein the image sensing circuit includes:
   a power supply for supplying a variable power to the photo-sensitive cell; and
   a plurality of storage elements synchronized to the variable power and storing an electric characteristic value generated at the photo-sensitive cell,
   wherein the wavelength or intensity of incident light are measured based on the electric characteristic value respectively stored in the plurality of storage elements.

9. The color image sensor according to claim 8, wherein the plurality of storage elements are a first capacitor and a second capacitor.

10. The color image sensor according to claim 9, further comprising:
    a first switching element for opening or closing a channel between the photo-sensitive cell and the first capacitor;
    a second switching element for opening or closing a channel between the photo-sensitive cell and the second capacitor; and
    a multiplexer synchronized with the variable power of the power supply to control a switching time of the first switching element and the second switching element,
    wherein the wavelength and intensity of incident light are measured based on the voltage values of the first capacitor and the second capacitor.

11. The color image sensor according to claim 10, wherein the first switching element and the second switching element are transistors.

12. A color image sensor, comprising:
    an image sensor array wherein a plurality of unit elements, each having a photo-sensitive cell including a lower electrode, an upper electrode, and a chalcogenide material located between the lower electrode and the upper electrode, are arranged;
    a column/row decoder for selecting a unit element of the image sensor array;
    a power supply for supplying power to the image sensor array; and
    a multiplexer for allowing the power supply to apply a variable power,
    wherein the lower electrode is made of at least one metal selected from the group consisting of molybdenum (Mo), gold (Au), silver (Ag), and platinum (Pt).

13. The color image sensor according to claim 12, wherein the unit element includes:
    a first storage element and a second storage element for storing the size of an electric characteristic value generated at the photo-sensitive cell;
    a first switching element for opening or closing a channel between the photo-sensitive cell and the first storage element; and
    a second switching element for opening or closing a channel between the photo-sensitive cell and the second storage element,
    wherein the color image sensor measures the wavelength and intensity of incident light based on the voltage values of the first capacitor and the second capacitor.

14. The color image sensor according to claim 13, wherein the first storage element and the second storage element are capacitors.

15. The color image sensor according to claim 13, wherein the first switching element and the second switching element are transistors.

16. The color image sensor according to claim 1, wherein the image sensing circuit comprises a plurality of charge storage elements storing charges generated from the photo-sensitive cell, the charge storage elements being electrically placed between the lower electrode of the photo-sensitive cell and ground.

17. The color image sensor according to claim 16, wherein the image sensing circuit further comprises a plurality of switching elements for opening or closing channels between the photo-sensitive cell and the charge storage elements, each switching element being electrically placed between the photo-sensitive cell and each charge storage element.

18. The color image sensor according to claim 8, wherein a first storage element of the plurality of storage elements stores the electric characteristic value generated at the photo-sensitive cell when the power supply provides a first voltage, and
    wherein a second storage element of the plurality of storage elements stores the electric characteristic value generated at the photo-sensitive cell when the power supply provides a second voltage.

19. The color image sensor according to claim 10, wherein the multiplexer turns on the first capacitor and turns off the second capacitor when the power supply provides a first voltage, and
    wherein the multiplexer turns on the second capacitor and turns off the first capacitor when the power supply provides a second voltage.

* * * * *